United States Patent
Schmukler

(10) Patent No.: US 6,271,727 B1
(45) Date of Patent: Aug. 7, 2001

(54) HIGH ISOLATION RF POWER AMPLIFIER WITH SELF-BIAS ATTENUATOR

(75) Inventor: Bruce C. Schmukler, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/370,116

(22) Filed: Aug. 6, 1999

(51) Int. Cl.[7] .................... H03G 3/10; H01P 1/22
(52) U.S. Cl. .............. 330/284; 330/285; 333/81 A; 333/81 R
(58) Field of Search .................. 330/284, 285; 333/81 A, 81 R

(56) References Cited

U.S. PATENT DOCUMENTS

| | | | |
|---|---|---|---|
| 3,912,949 | 10/1975 | Kalisvaart | 307/280 |
| 4,112,384 | 9/1978 | Buchberger | 330/141 |
| 4,275,362 | 6/1981 | Harford | 330/283 |
| 4,415,803 | 11/1983 | Muoi | 250/214 A |
| 4,464,635 | 8/1984 | Rypkema | 330/284 |
| 4,485,349 | 11/1984 | Siegal et al. | 330/3 |
| 4,494,076 | 1/1985 | Rinderle | 330/284 |
| 4,517,526 | 5/1985 | Di Cicco | 330/284 |
| 4,626,806 | 12/1986 | Rosar et al. | 333/104 |
| 4,646,036 | 2/1987 | Brown | 333/81 R |
| 4,654,610 | 3/1987 | Dasilva | 333/81 R |
| 4,689,498 | 8/1987 | Rinderle | 307/320 |
| 4,737,733 | 4/1988 | LaPrade | 330/277 |
| 4,766,395 | 8/1988 | Dolby | 330/284 |
| 4,883,984 | 11/1989 | Kess | 307/256 |
| 4,933,647 | 6/1990 | Dea et al. | 330/284 |
| 5,109,205 | 4/1992 | Hart et al. | 333/104 |
| 5,144,157 | 9/1992 | Russell et al. | 307/270 |
| 5,241,694 | 8/1993 | Väisänen et al. | 455/126 |
| 5,272,457 | 12/1993 | Heckaman et al. | 333/262 |
| 5,304,948 | 4/1994 | Mucke | 330/284 |
| 5,307,026 | 4/1994 | Mucke | 330/283 |
| 5,351,013 | 9/1994 | Alidio et al. | 320/284 |
| 5,392,464 | 2/1995 | Pakonen | 455/115 |
| 5,430,411 | 7/1995 | Boulic | 330/284 |
| 5,532,647 | 7/1996 | Kawakami | 330/284 |
| 5,651,073 | 7/1997 | Isu et al. | 381/108 |
| 5,694,082 | 12/1997 | Schmidt | 330/132 |
| 5,808,516 | 9/1998 | Barber | 330/282 |
| 5,862,464 | 1/1999 | Omagari | 455/280 |
| 5,914,544 | 6/1999 | Tanaka et al. | 307/130 |

OTHER PUBLICATIONS

Inder Bahl and Prakash Bhartia, "Microwave Solid State Circuit Design," pp. 660–672, 1988, Canada.

Primary Examiner—Benny Lee
Assistant Examiner—Patricia T. Nguyen
(74) Attorney, Agent, or Firm—Withrow & Terranova, P.L.L.C.

(57) ABSTRACT

A PIN diode attenuator and associated control circuits prevents self-biasing of bipolar device RF power amplifiers under large signal drive conditions. A power amplifier control signal controls the amount of current through the PIN diode attenuator. When the control signal is high for maximum output power, the PIN diode attenuator is turned off to obtain maximum drive level for the first RF stage. When the control signal is low for maximum isolation, the PIN diode attenuator is turned on to reduce the drive level and to avoid self-biasing. The PIN diode attenuator and associated control circuits allow the RF power amplifier to operate normally when the amplifier is in its forward gain mode. The RF input signals to the power amplifier are attenuated however, when the amplifier is turned off or in a transition state between the forward gain mode and the off mode, to ensure a high isolation state that prevents self-biasing of the power amplifier or portions thereof under large signal conditions.

24 Claims, 14 Drawing Sheets

HIGH ISOLATION RF POWER AMPLIFIER WITH SELF-BIAS ATTENUATOR

BACKGROUND OF THE INVENTION

(1) Field of the Invention

The present invention relates generally to power amplifier control and, more particularly, to a high isolation radio frequency (RF) power amplifier having a PIN diode attenuator control circuit for substantially eliminating self-biasing of bipolar devices associated with the RF power amplifier under large signal drive conditions.

(2) Description of the Prior Art

Consumer demand for wireless communication is ever increasing worldwide, placing a burden on the existing cellular infrastructure. In Europe, the increased demand led regulators to create the DCS cellular telephone band. DCS utilizes GSM baseband technology at canier frequencies near 1.8 GHZ.

Also in response to consumer demand, cellular telephone manufacturers strive to reduce the size and weight of their phones. With the introduction of DCS, and the creation of dual band GSM/DCS phones, the quest for ever smaller components has intensified. Manufacturers frequently specify the use of a 3-volt battery, either a single lithium ion cell, or a plurality of nickel/metal hydride (NiMH) cells to help reduce phone size and weight. With such a power source, manufacturers also specify various specifications for certain performance characteristics. Some of the most important characteristics are associated with low voltage operation, power, high efficiency, small size and power control. For example, many manufacturers presently specify that the DCS power amplifier must be capable of operating with the battery voltage as low as 2.7 volts, with a nominal voltage near 3.2 volts. This specification allows greater utilization of the battery charge to maximize talk time while complying with DCS standards. In view of the foregoing manufacturing specifications, it is desirable in the industry to provide a workable DCS power amplifier utilizing bipolar device technology.

Isolation of bipolar device power amplifiers under large signal drive conditions however, has been particularly problematic. For example, when the control voltage to a power amplifier is at 0 volts, the amplifier should be turned off. During this off condition, the power amplifier generally is required to have a specified minimum isolation between its input and its output. Self-biasing of specific bipolar devices can occur under certain large signal drive conditions. This self-biasing can reduce the aforesaid isolation by turning on one or more stages of a bipolar device implemented power amplifier. Techniques have been developed that attempt to reduce or eliminate the degree of self-biasing described above. Using power amplifiers constructed with MESFET technology help to minimize this problem since they are less susceptible to self-biasing as compared with power amplifiers constructed with bipolar devices. Another technique used to reduce or eliminate the aforesaid self-biasing includes the use of discrete devices to enhance the degree of isolation per stage. Other techniques have also been utilized, including use of a RF switch at the input to the power amplifier.

Although the foregoing techniques may have proven successful in certain limited applications, these techniques are not as desirable in applications specific to integrated circuit design where size and cost constraints are of paramount importance. For example, discrete designs simply are not feasible when a system application necessitates sole use of integrated circuit structures. Additionally, certain technologies, e.g., GaAs HBT technology requires fewer external components than a MESFET design and generally has higher efficiency as well. Further, MESFET's tend to require external switches to be turned off completely under certain operating conditions. Use of such external switches is undesirable when associated with integrated circuit structures since they can add to component count, size and cost.

Thus, there remains a need for a new and improved integrated circuit power amplifier control circuit suitable for use with bipolar device power amplifiers and that effectively minimizes power amplifier self-biasing under large signal drive conditions thereby ensuring optimum isolation between the power amplifier input point and the power amplifier output point, regardless of the amplifier large signal drive level.

SUMMARY OF THE INVENTION

The present invention is directed in part to a PIN diode attenuator system particularly useful in association with an integrated circuit design to effectively minimize self-biasing that can occur under large signal drive conditions associated with bipolar device RF power amplifiers. The PIN diode attenuator is electrically coupled to the RF input of the bipolar device RF power amplifier. One embodiment comprises a RF power amplifier having an RF signal input; a PIN diode electrically coupled to the RF signal input; and a variable current source having a control signal input and configured to adjust current flow through the PIN diode in response to a control signal to the control signal input, such that RF signals to the RF signal input are not attenuated when the RF power amplifier is in its forward gain mode and such that RF signals to the RF signal input are substantially fully attenuated when the RF power amplifier is in its filly off mode and further such that RF signals to the RF signal input are variably attenuated when the RF power amplifier is in a transition state between the forward gain mode and the fully off mode, wherein RF signals to the RF signal input are attenuated to minimize self-biasing associated with the RF power amplifier configured to receive the attenuated RF signals.

Another embodiment uses a HBT RF power amplifier having a RF signal input, a PIN diode having its anode electrically coupled to the RF signal input and its cathode electrically coupled to ground and further having a variable current source including a power amplifier control voltage input and a DC current output, the DC current output being electrically coupled to the anode.

Yet another embodiment uses a RF power amplifier having a RF signal input and a RF signal output; diverting means for diverting a desired portion of a RF signal to ground and away from the RF signal input; and controlling means for varying the desired RF signal portion diverted to ground in response to a power amplifier control signal to generate an attenuated RF signal such that a predetermined isolation is achieved between the RF signal input and the RF signal output.

Still another embodiment comprises a RF amplifier having a RF signal input; a RF signal path associated with the RF signal input, the RF signal path having a predetermined attenuation characteristic; current generating means for providing a variable DC current having a value determined by a RF power amplifier control voltage; and means responsive to the current generating means for changing the attenuation characteristics associated with the RF signal path in response to the variable DC current wherein the attenuation characteristics are dependent upon the value of the DC current necessary to substantially eliminate self-biasing of the RF amplifier when the RF amplifier is not in a forward gain operating mode.

An associated network turns off the RF power amplifier when the power control voltage is at 0 volts, and also turns off all bias to the PIN diode attenuator when the PIN diode attenuator enable input is low, e.g. less than 0.3 volts, such that a switched regulated voltage is not required to make the RF power amplifier operational.

The current through the PIN diode is controlled by two signals: AT_EN and APC. The AT_EN signal allows current flow through the PIN diode and is an on/off function. The APC signal controls the amount of current through the PIN diode. Generally, the AT_EN signal will be derived from the VCO ENABLE signal available in most Global System for Mobile Communications (GSM) handset designs. If maximum isolation is needed before the ramp-up, the AT_EN signal generally needs to be turned on before the RF power is applied to the device input.

The current through the PIN diode is also inverted from the APC voltage via an inverting stage at the APC input. Thus, when the APC voltage is high for maximum output power, the PIN diode attenuator is turned off to obtain maximum drive level for the first RF stage. When the APC voltage is low for maximum isolation, the PIN diode attenuator is turned on to reduce the drive level and to substantially avoid self-biasing.

Accordingly, one feature of the present invention includes an attenuator and method for minimizing self-biasing of a bipolar device RF power amplifier under large signal drive conditions.

Another feature of the present invention includes an attenuator for minimizing self-biasing of a bipolar RF power amplifier under large signal drive conditions and that is smaller and less expensive than an attenuator that performs the same function using discrete components.

Still another feature of the present invention includes an attenuator for minimizing self-biasing of a bipolar RF power amplifier under large signal drive conditions and that uses fewer components than an attenuator that performs the same function using MESFET components.

Yet another feature of the present invention includes an attenuator for minimizing self-biasing of a bipolar RF power amplifier under large signal drive conditions and that ensures the power amplifier is in a high isolation mode when it is turned off.

Still another feature of the present invention includes an attenuator for minimizing self-biasing of a bipolar RF power amplifier under large signal drive conditions and that does not continue to draw current when the power amplifier is dormant.

Still another feature of the present invention includes an attenuator for minimizing self-biasing of a bipolar RF power amplifier under large signal drive conditions and that is formulated using GaAs Heterojunction Bipolar Technology (HBT).

Still another feature of the present invention includes an attenuator for minimizing self-biasing of a bipolar RF power amplifier under large signal drive conditions and that does not require external switches to turn on the attenuator.

These and other features of the present invention will become apparent to those skilled in the art after a reading of the following description of the preferred embodiment when considered with the drawings.

DESCRIPTION OF THE PREFERRED EMBODIMENTS

Figure 1:
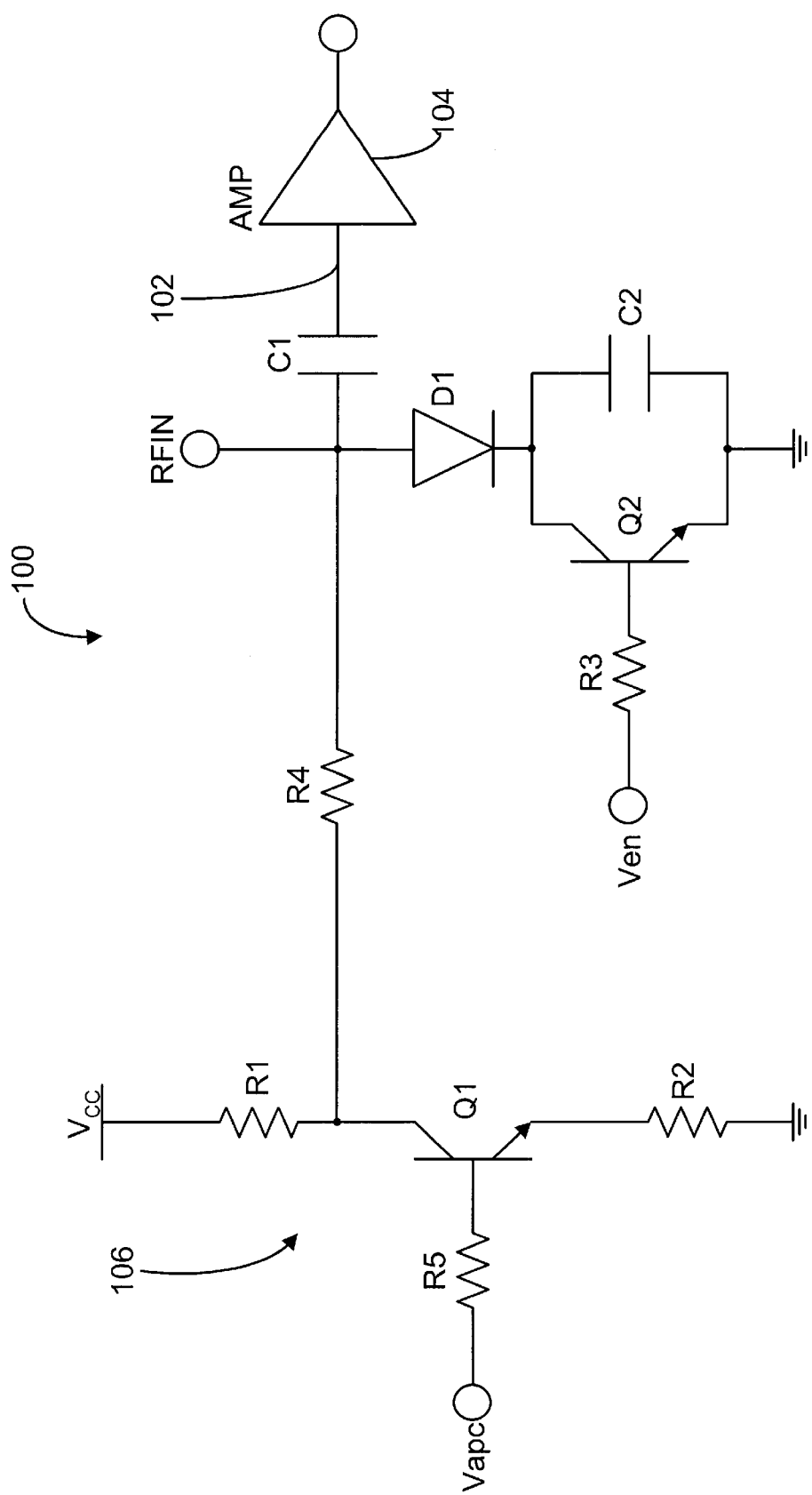
FIG. 1 is a schematic diagram illustrating a PIN diode attenuator control system constructed according to one embodiment of the present invention.

In the following descriptions, like reference characters designate like or corresponding parts throughout the several views. Referring now to the drawings in general and FIG. 1 in particular, it will be understood that the illustrations are for the purpose of describing a preferred embodiment of the invention and are not intended to limit the invention thereto. As shown in FIG. 1, a PIN diode attenuator and associated control circuits, generally designated 100, are shown constructed according to one embodiment of the present invention. The PIN diode attenuator and associated control circuits 100 include PIN diode D1. The impedance of PIN diode D1 drops as current to it increases, shunting power away from the input 102 to the power amplifier 104. Capacitor C1 is a blocking capacitor to the power amplifier 104 and may or may not be required, depending upon the power amplifier 104 bias level. A bipolar junction transistor Q2 shuts off current to the PIN diode D1 when transistor Q2 is in its dormant or off state. A control voltage Ven is used to turn transistor Q2 on or off. When control voltage Ven is low, current through transistor Q2 is zero. Otherwise, when control voltage Ven is high (greater than the Vbe threshold voltage in the instant case), current can flow through transistor Q2. Capacitor C2 is an optional high frequency bypass capacitor associated with transistor Q2. The use of capacitor C2 generally provides more reliable PIN diode functionality as compared with a like PIN diode attenuator and associated control circuits devoid of such a high frequency bypass capacitor. Resistor R4 acts as a radio frequency (RF) choke associated with PIN diode D1. Transistor Q1 and resistors R1, R2 and R5 form an inverting amplifier 106 to control the current to the PIN diode D1 as a function of control voltage Vapc. The ratio of R1 resistance to R2 resistance can be used to set the slope of the current to the PIN diode D1 as a function of control voltage Vapc. Larger ratios for resistor R1 to resistor R2 create larger slopes of the aforesaid current to the PIN diode D1 with respect to control voltage Vapc.

Test results relating to the PIN diode attenuator and associated control circuits 100 are depicted in Table 1 below. The test results shown in Table 1 illustrate the effectiveness of the PIN diode attenuator and associated control circuits 100 at high input powers, approximately 10 dBm. Specifically, Table 1 summarizes test results associated with a three-stage DCS power amplifier utilizing the concepts described herein above in association with the PIN diode attenuator and associated control circuits 100.

TABLE I

Measured Forward Isolation
Pin = 10 dBm, Ven = 2.7 V, Vapc = 0.3 V

| Vcc | 1710 MHz | 1747 MHz | 1785 MHz |
|---|---|---|---|
| 2.7 V | 36.0 dB | 34.0 dB | 33.2 dB |
| 3.2 V | 36.0 dB | 34.0 dB | 33.5 dB |
| 4.5 V | 36.4 dB | 34.1 dB | 33.5 dB |

Typical isolation achievable under the same test conditions without use of a PIN diode attenuator and associated control circuits is about 23 dB or less. In view of the foregoing test results, the present invention provides at least 10 dB of improved isolation. Further tests provided results of up to 44 dB of isolation. The present invention demonstrates the most improvement in isolation characteristics under high input drive power conditions. Test results demonstrate that all current to the power amplifier 104 can be turned off when control voltage Vapc is less than or equal to about 0.3 volts and control voltage Ven is less than or equal to about 0.3 volts.

Figure 2:
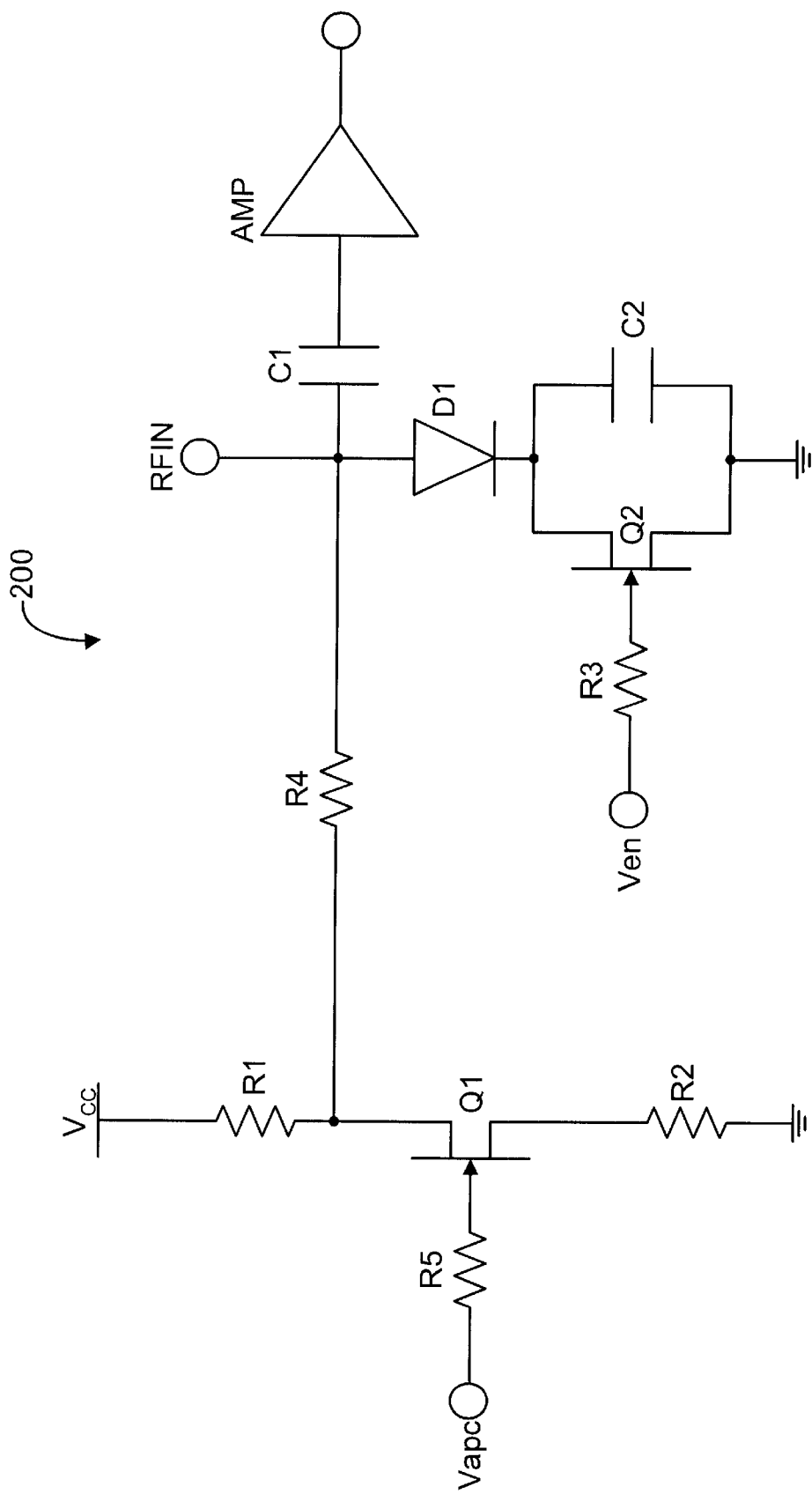
FIG. 2 is a schematic diagram illustrating a PIN diode attenuator control system constructed according to another embodiment of the present invention.

Turning now to FIG. 2, there is shown a PIN diode attenuator and associated control circuits, generally designated as 200, in accordance with another embodiment of the present invention. As shown, the present invention can be implemented exclusively using field effect transistors (FET) rather than bipolar junction transistors (BJT). It shall be understood the present invention is not so limited and that the present invention can also be implemented using a mix of transistor technologies.

Figure 3:
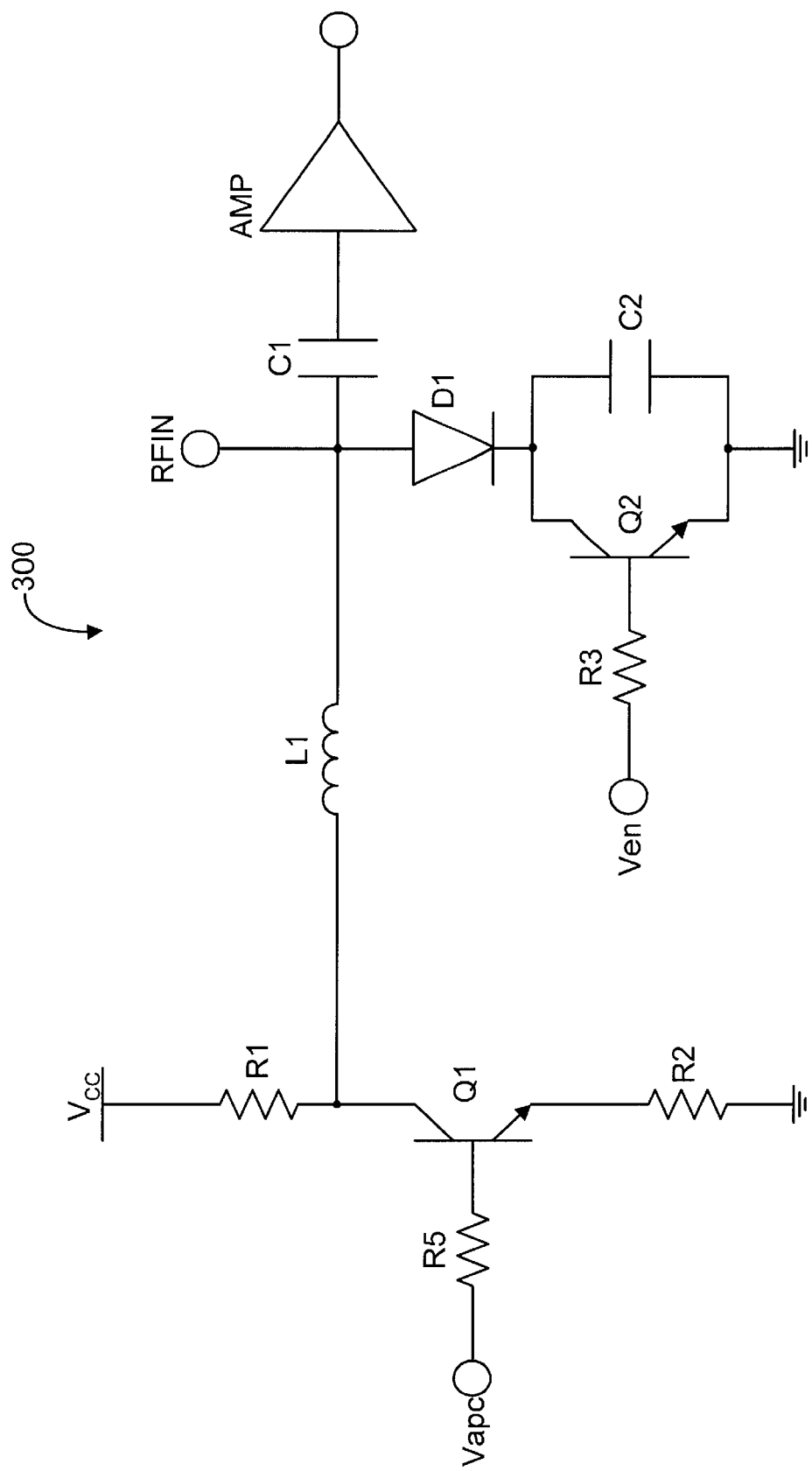
FIG. 3 is a schematic diagram illustrating a PIN diode attenuator control system constructed according to yet another embodiment of the present invention.

FIG. 3 depicts another embodiment of the PIN diode attenuator and associated control circuits, designated generally as 300, that can be formulated by replacing the resistor R4 depicted in FIGS. 2 and 3 with an inductor L1. Use of this embodiment can result however, in a higher current to the PIN diode D1, even if the supply voltage remains the same. Such use of an inductor can therefore increase the ratio of the lowest PIN diode impedance (which occurs at the highest PIN diode current), to the highest PIN diode impedance, which occurs when there is no PIN diode current. One known disadvantage of this embodiment is the necessity to use a large inductance value, which results in a physically large device. Larger devices require greater amounts of IC chip area which is costly.

Figure 4:
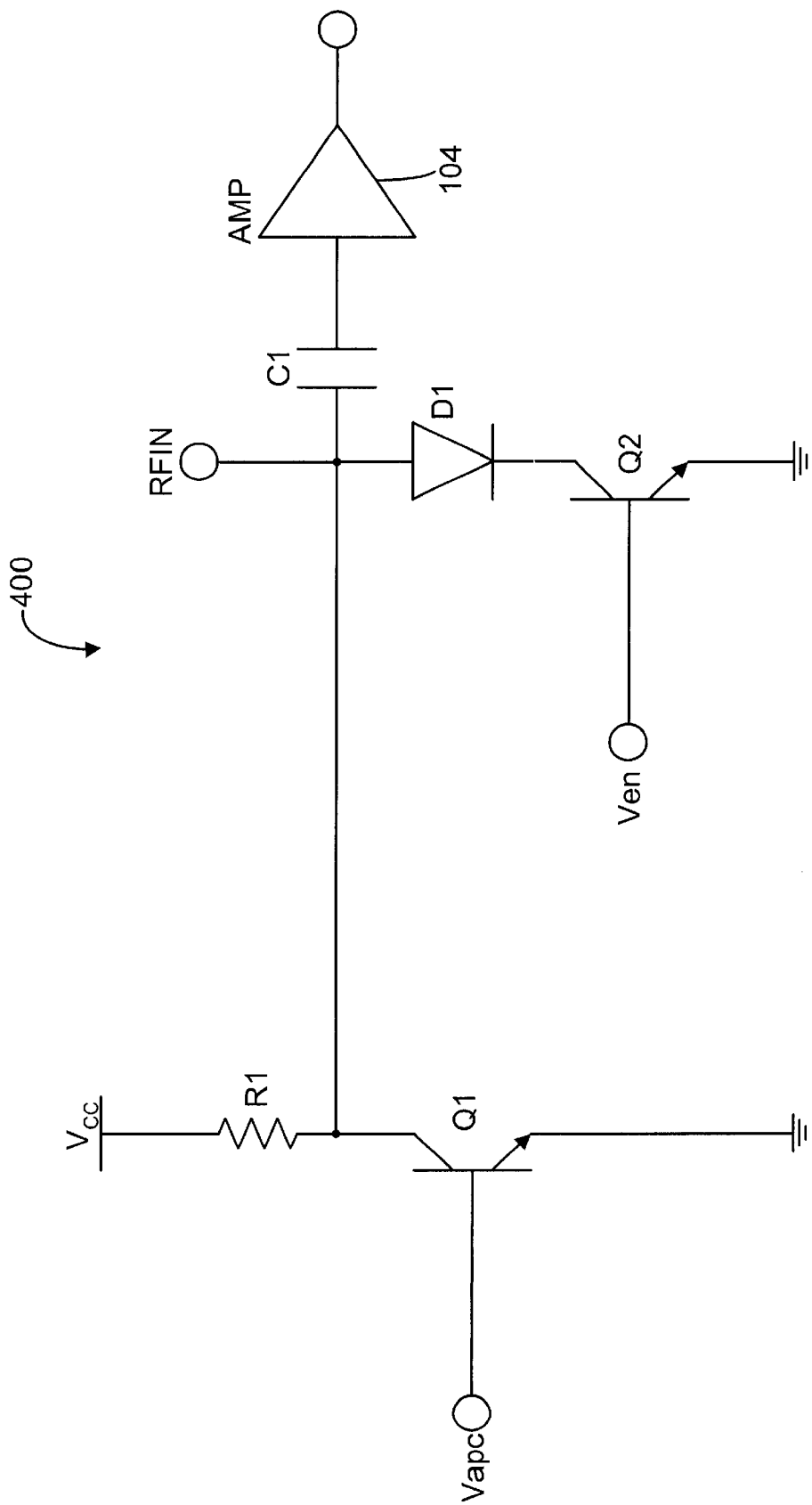
FIG. 4 is a schematic diagram illustrating a PIN diode attenuator control system constructed according to still another embodiment of the present invention.

FIG. 4 depicts a circuit that illustrates the present invention can be implemented without use of any one or combination of resistors R2, R3, R4 and R5 and capacitor C2. A minimal implementation of the present invention showing a PIN diode D1 and associated control circuits, designated generally as 400, is illustrated in FIG. 4 in accordance with one embodiment of the present invention. Specifically, a PIN diode D1 is used in combination with transistor Q2 to shunt current away from the power amplifier 104. Resistor R1 and Transistor Q1, operating generally in the active region, formulate a basic inverting amplifier to control the current to PIN diode D1.

A description for one commercial implementation of the present invention described herein above follows with reference to FIGS. 5–13. Specifically, key industry parameters including battery voltage, frequency of operation, power, gain and efficiency have been successfully addressed in association with a model RF2140, 3 volt GaAs/AlGaAs HBT power amplifier integrated circuit available from RF Micro-Devices, Inc. of Greensboro, N.C. GaAs/AlGaAs HBT technology was chosen for its high breakdown voltage, gain, available power, efficiency and single supply operation. HBT devices are generally created on a semi-insulating substrate by using Molecular Beam Epitaxy (MBE). Silicon is used for the n-type dopant and beryllium for the p-type dopant. The devices are fabricated using a self-aligning ohmic metal process where a double photoresist liftoff technique aligns the base ohmic contact to within 0.15 um of the emitter mesa edge. The emitter and base mesa are formed by wet etch and boron implantation provides device isolation. An As/Ga flux ration of 3:1 is utilized with a substrate temperature at approximately 570° C. The resulting profile is optimized for reliability. HBT devices have been found to provide exemplary voltage compliance for a wideband amplifier. Further, the HBT base-collector capacitance is small and more constant then either the Si BYT or the MESFET. Industry experience has shown that highly efficient wideband linear amplifiers can be formulated using GaAs HBT devices. GaAs HBT technology is a proven technology which uses a GaAs/AlGaAs heterostructure for producing bipolar devices. However, as stated herein before, self-biasing of bipolar devices can occur under certain large signal drive conditions. A solution to the foregoing problem is achieved using the present invention discussed with reference to FIGS. 14 in association with GaAs HBT technology.

Figure 5:
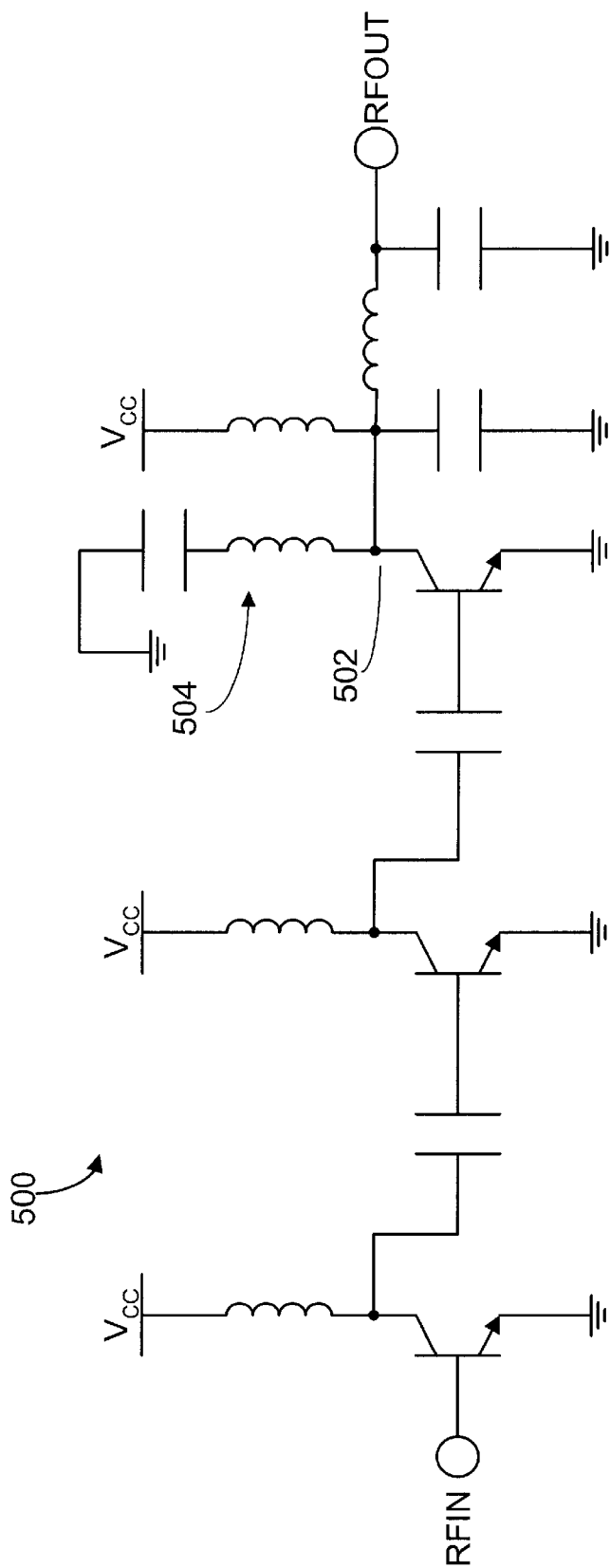
FIG. 5 is a schematic diagram illustrating a classic three-stage power amplifier disclosed in the prior art.

FIG. 5 is a schematic diagram illustrating a classic three-stage bipolar power amplifier 500 used to partially formulate the RF2140 DCS power amplifier. Multiple-stage power amplifiers generally are necessary to achieve the required power and gain at DCS frequencies. Bipolar technology is chosen for the reasons discussed herein above. Output matching for the power amplifier 500 can be seen to include two LC sections to transform a load to a load line at the output collector 502. Efficiency is enhanced via a series resonant second harmonic trap 504 placed on the output collector 502. The bipolar power amplifier 500 formulated with GaAs HBT devices was found sufficient to meet the requisite DCS standards excepting the essential isolation characteristics.

Isolation generally is characterized as a function of input drive level and Vapc leading to the discovery of two separate mechanisms limiting isolation. One mechanism is the small-signal isolation. At high input drive levels of 10 dBm, however, the isolation is degraded significantly from the small-signal limit due to self-biasing of the bipolar transistors, which necessarily should be deactivated but are partially turned on by the input drive levels. In this self-bias regime, the isolation is not constant with input drive power, but degrades significantly as input power increases. SPICE simulations, a tool familiar to those skilled in the art of circuit modeling, lead to the aforesaid discoveries and are discussed herein below with reference to FIGS. 6–8.

Figure 6:
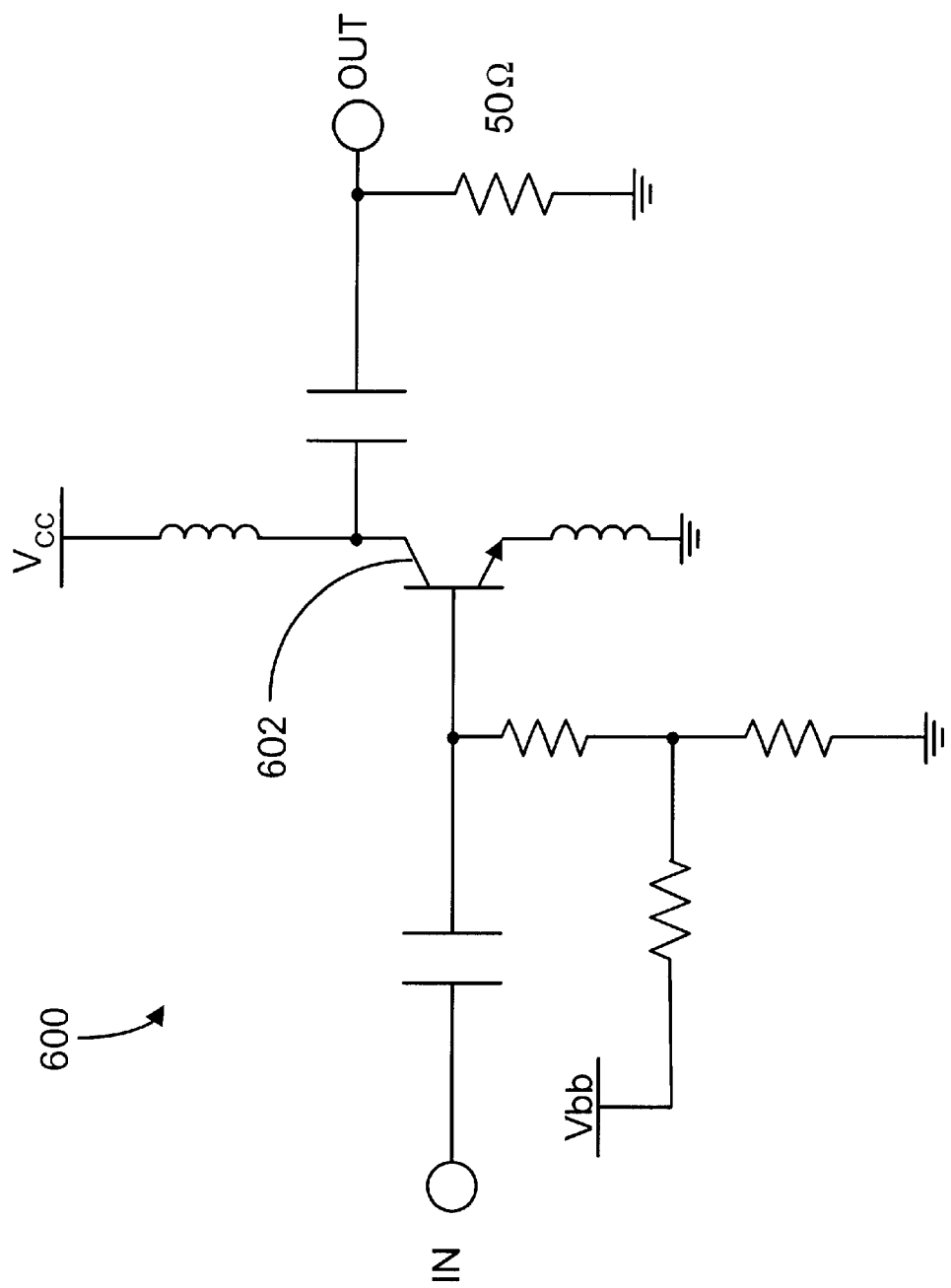
FIG. 6 is a schematic diagram illustrating a single-stage amplifier suitable to simulate self-bias effects on isolation associated with the first-stage of a three-stage digital communication system (DCS) power amplifier.

FIG. 6 depicts a schematic diagram illustrating a SPICE model for a single-stage DCS power amplifier 600 suitable to simulate self-bias effects on isolation associated with the first-stage of a three-stage digital communication system (DCS) power amplifier such as that depicted in FIG. 5. Transient SPICE simulations were performed on amplifier 600 with input power as a parameter and with the resulting output power and collector current as a function of input power. It was found that the bipolar transistor 602 self-biases, turning itself on when it should be off at input powers above 6 dBm, at which point the output power increases more rapidly than the input power. This was found to correspond to the point where the transistor 602 self-biases. A graphical representation 700 of this relationship is shown in FIG. 7 as discussed below.

Figure 7:
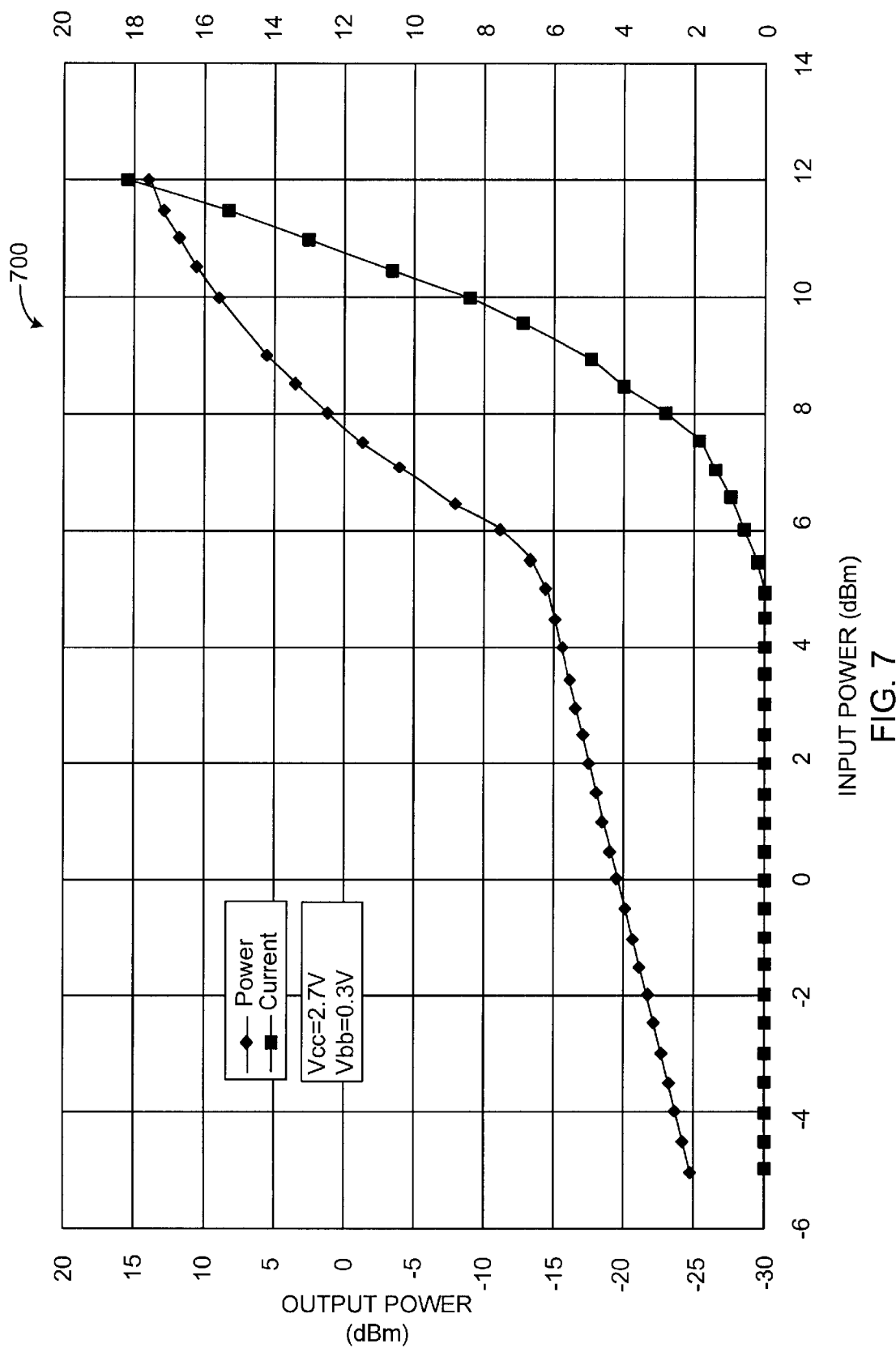
FIG. 7 is a graph illustrating simulated output power and current as a fumction of input power to depict the effects of self-biasing associated with the single-stage amplifier shown in FIG. 6.
Figure 8:
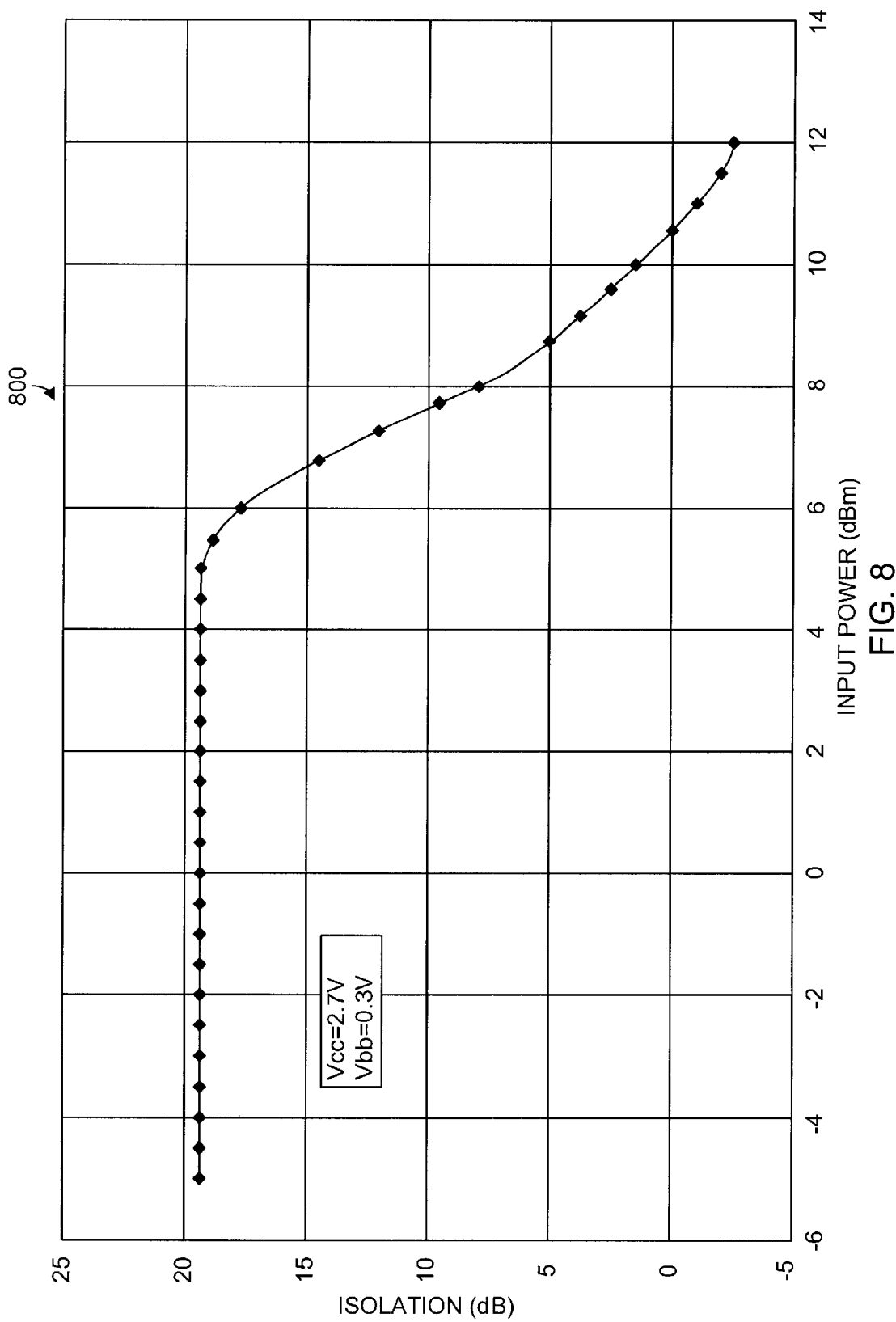
FIG. 8 is a graph illustrating the resulting input/output isolation as a function of input power for the single-stage amplifier depicted in FIG. 6.

FIG. 7 is a graphical representation 700 illustrating simulated output power and current as a function of input power to depict the effects of self-biasing associated with the single-stage amplifier shown in FIG. 6. As shown, the isolation degrades rapidly as input power increases; and the isolation actually results in gain above the 10 dBm level as illustrated by the graphical representation 800 shown in FIG. 8. Possible solutions to overcome the foregoing self-biasing problem are known in the art. For example, complex timing can be used to activate the driver VCO just before the power amplifier; or a second isolation switch can be used to provide additional isolation. However, these and other known approaches are not desirable for DCS applications since they add complexity, components, loss, or cost. The present invention demonstrates a preferred method to substantially eliminate effects of self-biasing.

In a preferred embodiment, the first-stage of a three-stage bipolar DCS power amplifier can not be exposed to an input drive level of 10 dBm when Vapc=0.3 volts in order to eliminate the self-biasing effect. Additionally, when Vapc is at full value, it is desired that the first-stage be subjected to the full input power level in order to obtain maximum output power and high efficiency. Thus, when Vapc is low, power must be shunted away from the first-stage. When Vapc is high, additional losses cannot be added to the RF path. Additionally, it is preferred that all currents be zero to avoid battery drain when the power amplifier is dormant. The foregoing characteristics were achieved in association with one embodiment of the present invention as shown in FIG. 9.

Figure 9:
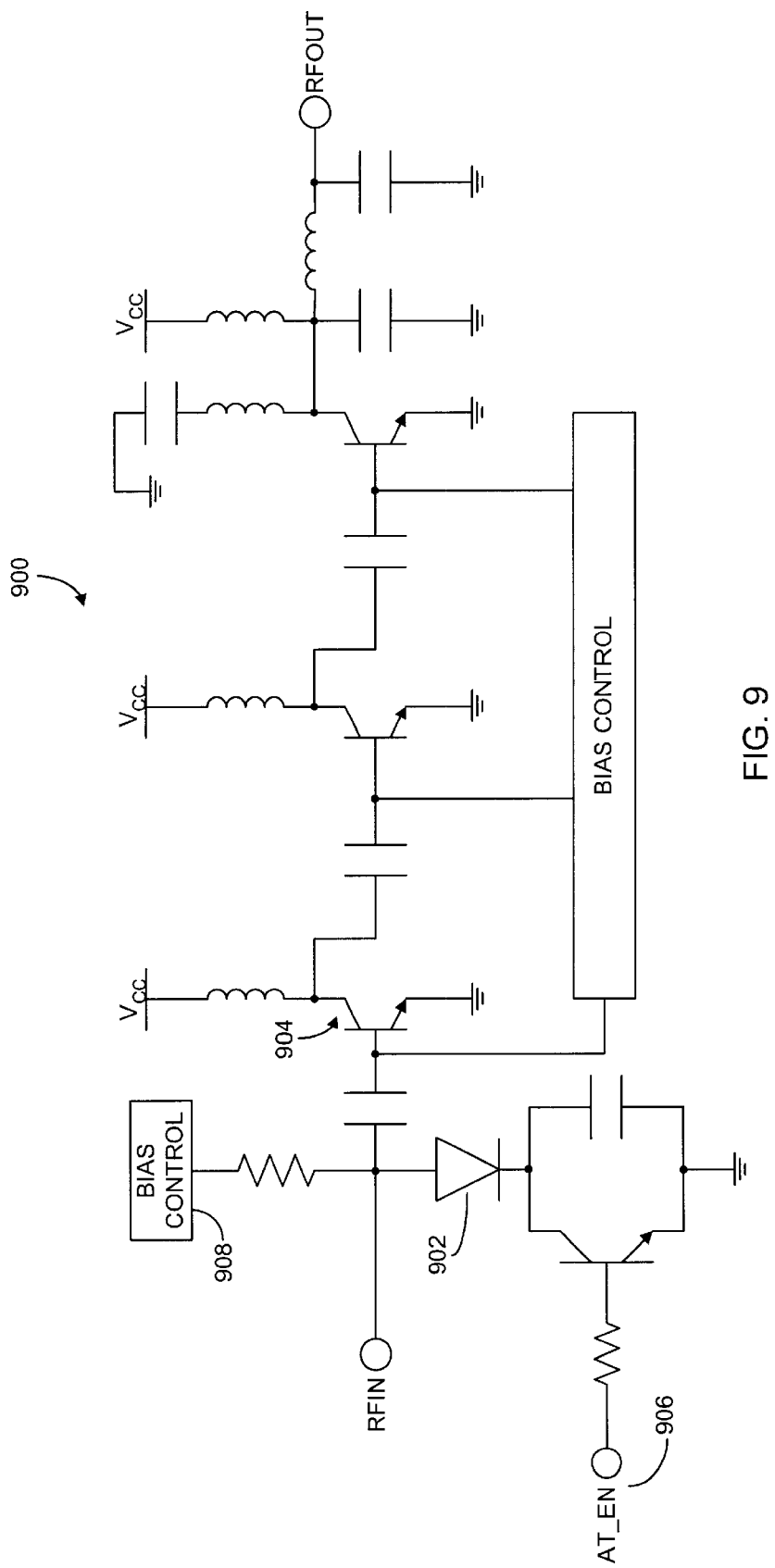
FIG. 9 is a schematic diagram illustrating a PIN diode attenuator coupled in front of the first-stage of the classic three-stage power amplifier shown in FIG. 5 according to one embodiment of the present invention.

FIG. 9 contains a schematic diagram of a bipolar amplifier 900 with a PIN diode attenuator 902 coupled in front of the first-stage 904 of the classic three-stage power amplifier 500 shown in FIG. 5 according to one embodiment of the present invention. The PIN diode attenuator 902 is turned on when the power amplifier control voltage Vapc in association with the Bias Control 908 is low, to shunt power away from the first-stage 904. The PIN diode attenuator 902 is turned off when the power amplifier control voltage Vapc is high, such that there is no RF path loss under normal amplifier operation. The bias control 908 adjusts the PIN diode attenuator 902 current with Vapc to supply current to the PIN diode attenuator 902 when Vapc is low and to tap the current as Vapc is increased. The PIN diode attenuator 902 at high Vapc is in its off state and functions like an open circuit. At low Vapc, the PIN diode attenuator 902 functions like a resistor, attenuating the RF path. The PIN diode attenuator 902 reduces the input VSWR at low Vapc, eliminating the need for extra matching components.

The AT_EN enable control signal 906 is used to control the input for the PIN diode attenuator 902. As stated herein, one purpose of the PIN diode attenuator 902 is to attenuate the RF input drive level when the power amplifier control voltage is low. This serves both to reduce the leakage through the device caused by self-biasing when faced with high level at the RF input, as well as to maintain a good input match when the bias of the input stage is turned off. Importantly, the AT_EN enable control signal 906 is used to turn off the PIN diode attenuator 902 when the entire bipolar amplifier 900 is off. As stated herein, without the enable control signal 906, the PIN diode attenuator 902 would constantly draw current and drain the battery (not shown), even when the phone (not shown) is off. Normally, the AT_EN enable control signal 906 will be derived from the VCO ENABLE signal (not shown) available in most GSM handset designs.

Figure 10:
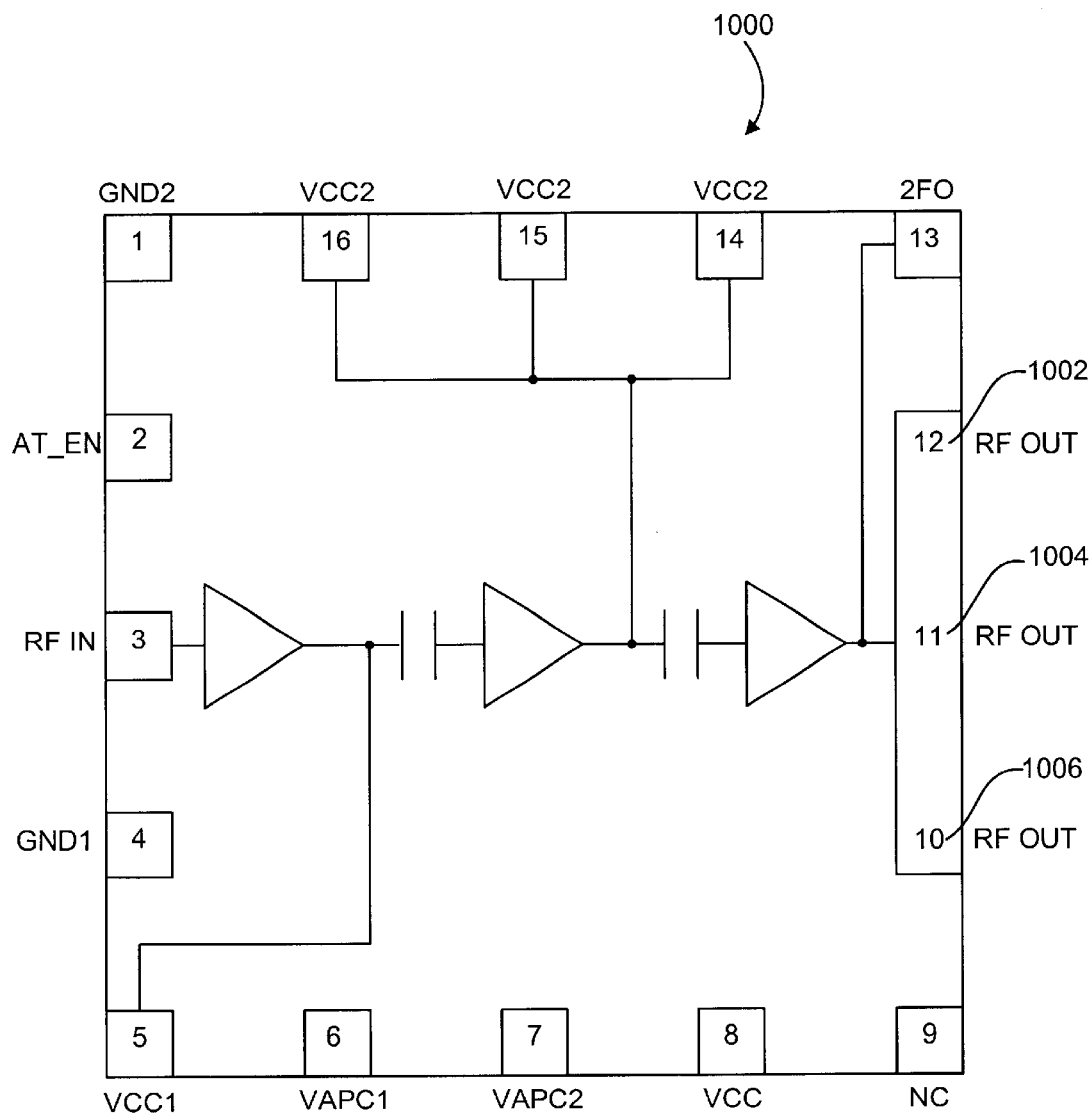
FIG. 10 illustrates one embodiment of a functional block diagram suitable for use with the PIN diode attenuator and three-stage power amplifier shown in FIG. 9.

FIG. 10 illustrates a functional block diagram for a model RF2140 DCS integrated circuit power amplifier 1000 that utilizes the present invention according to one preferred embodiment. Preferably, the power amplifier 1000 is contained within a protective package having low lead inductance, good thermal performance, easily automated production and low cost, i.e., small, leadless, ceramic package. As shown in FIG. 10, three of the amplifier leads 1002, 1004, 1006 preferably are fused together to lower the parasitic output inductance, thereby simplifing output matching at higher frequencies. Pin-to-pin mutual inductance can be reduced due to use of small size and positioning of pins at 90° angles as contrasted with two row designs. The use of small, leadless packaging was found to reduce the parasitic inductance by at least a factor of two and up to a factor of about four compared to competing leaded, exposed-die-flag packages. The physical structure, as shown in FIG. 10, was achieved using ceramic technology in association with an air cavity lid encapsulation to create a package well suited for high frequency RFIC applications.

With continued reference to FIG. 10, pin 1 is a ground connection for the driver stage. Preferably, pin 1 should be associated with physically short traces and should be connected initially to a ground plane for improved performance. Pin 1 should have its own vias to the ground plane to minimize any common inductance. Pin 2, as stated herein above, is a control input for the PIN diode attenuator 902. Pin 3 provides for the RF input. Preferably, this RF input is a 50 Ohm input, but the actual impedance depends on the interstage matching network connected to pin 3. An external DC blocking capacitor preferably is used if pin 3 is connected to a DC path to ground or a DC voltage. Pin 4 is the ground connection for the pre-amplifier (first) stage. Preferably, pin 4 has its own vias to the ground plane to minimize any common inductance. Traces associated with pin 4 preferably are made as short as possible and connected initially to the ground plane. Pin 5 is a power supply input for the pre-amplifier or first-stage and also provides some frequency selectivity to tune to the operating band since it forms the shunt inductance needed for proper tuning of the interstage match. Essentially, the bias is fed to this pin through a short microstrip. A bypass capacitor sets the inductance characteristics presented to the IC, making placement of the bypass capacitor a factor that can affect the frequency of the overall gain peak. Preferably, this supply should be bypassed individually with 100 pF capacitors before being combined with Vcc for the output stage to prevent feedback and oscillations. Pin 6 is a power control input for the driver or second-stage of the IC power amplifier. When his pin is "low," all circuits are shut off. A "low" typically is 0.5 volts or less at room temperature. In this embodiment, shunt bypass capacitor is preferred. Pin 7 is similar to pin 6, except pin 7 is the power control for the output or third-stage of the IC power amplifier. Pin 8 is the power supply input for the bias circuits associated with the different amplifier stages. Pin 10 is the RF output as well as the power supply input for the output stage. Bias voltage for the final stage is provided through this wide output pin. Preferably, an external matching network should be provided in association with pin 10 to ensure optimum load impedance. As stated herein before, three of the leads (pins 10, 11 and 12 in the instant case), are fused together to lower the parasitic output inductance, simplifying output matching at higher frequencies. Pin 13 provides the connection for the second harmonic trap discussed herein. This pin is internally connected to the RF OUT pins 10, 11 and 12. The bonding wire together with an external capacitor form a series resonator that preferably should be tuned to the second harmonic frequency in order to increase efficiency and reduce spurious outputs. Pins 14, 15 and 16 provide the power supply input for the driver stage and also forms the shunt inductance needed for proper tuning of the interstage match. Proper configuration, position and value of the external components used in association with the RF2140 DCS IC power amplifier is important for optimum performance.

Figure 14:
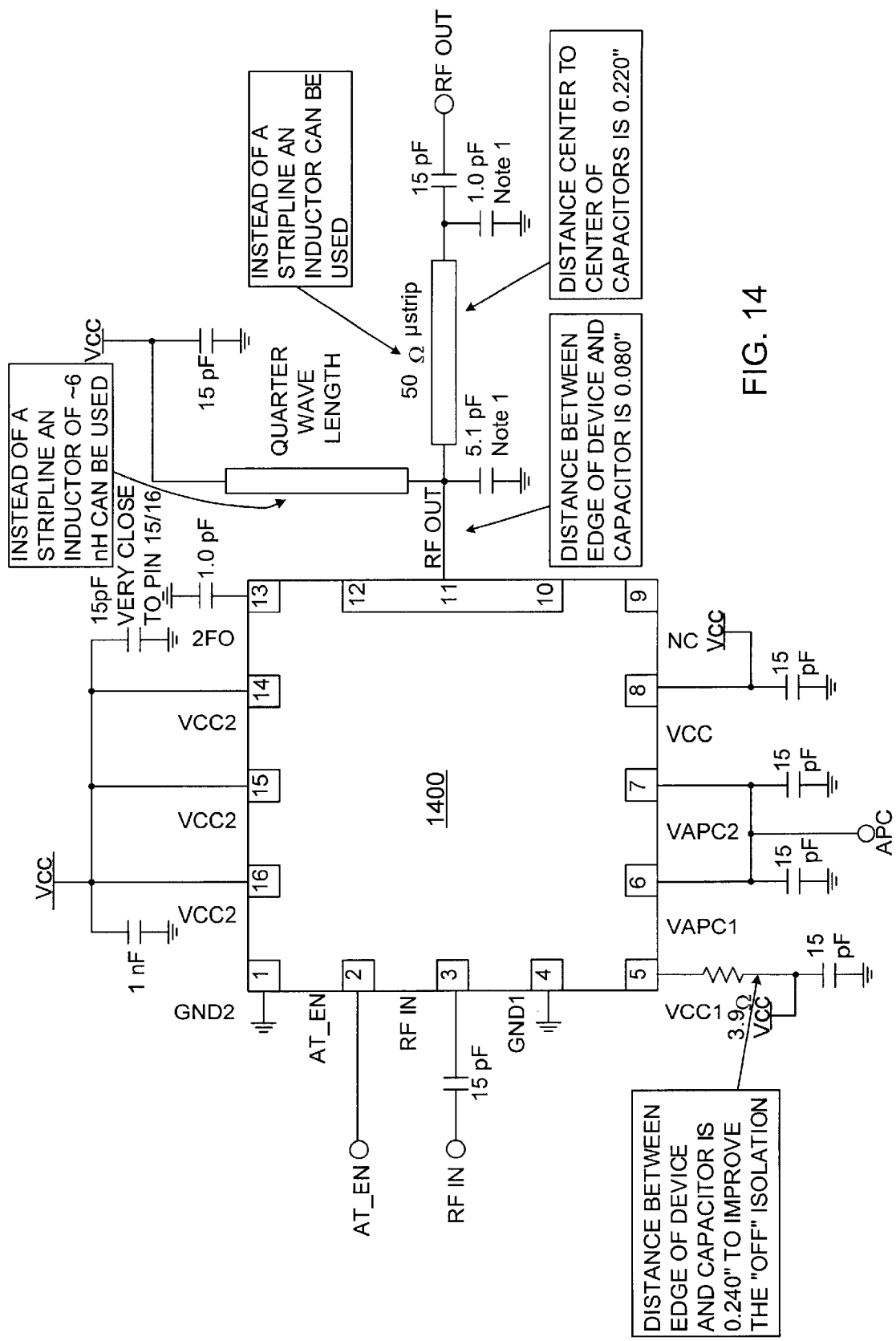
FIG. 14 is a schematic diagram depicting proper use of external components associated with a model RF2140 DCS IC power amplifier.

FIG. 14 is an application schematic diagram depicting proper use of external components used in association with the RF2140 power amplifier 1400. The ground connection for the output stage of the RF 2140 power amplifier 1400 is provided by the package base that preferably is connected to the ground plane by vias directly under the RF2140 device.

Figure 11:
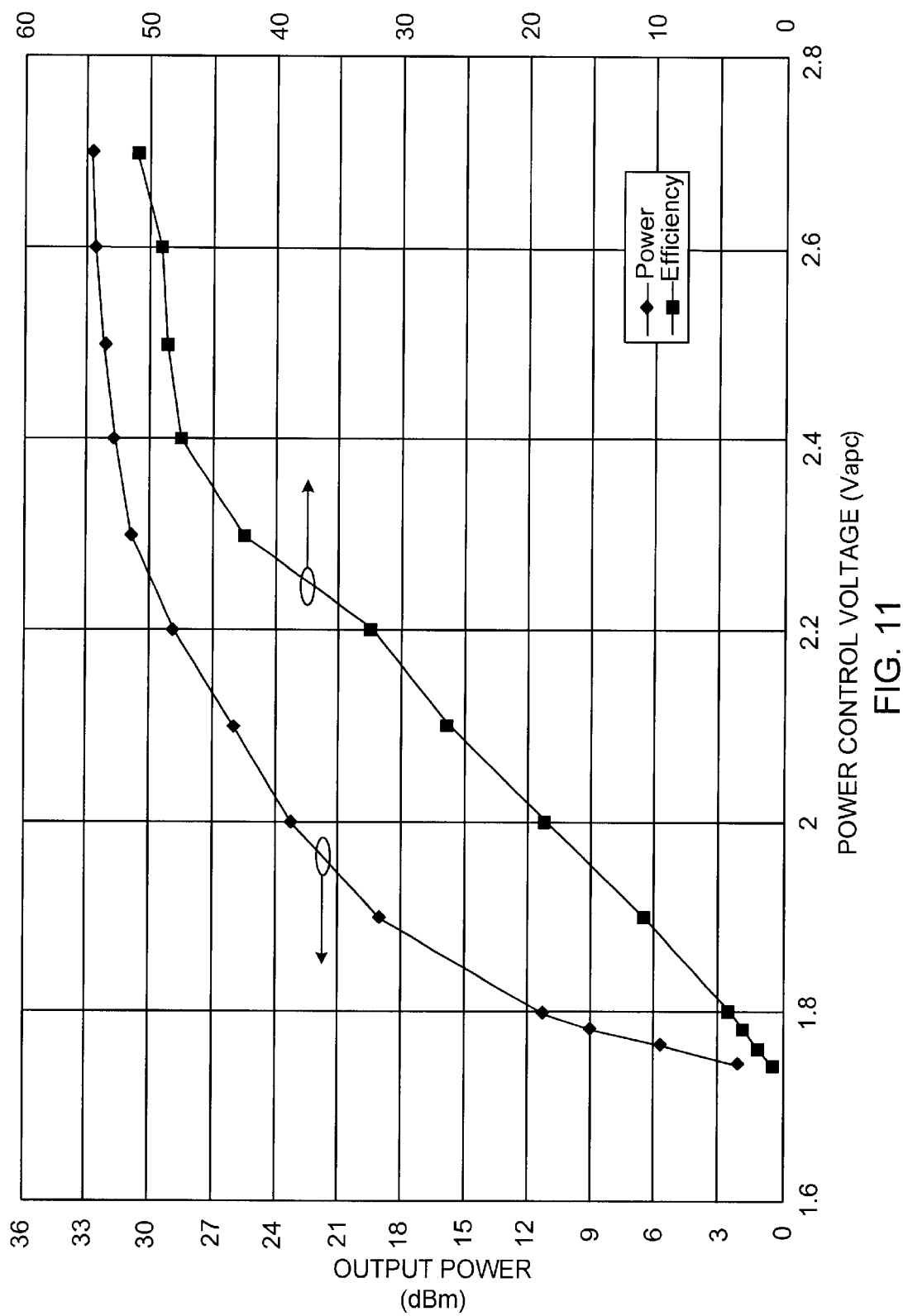
FIG. 11 is a graph illustrating the output power and associated power-added efficiency (PAE) as a function of power control voltage with supply voltage set at 3.2 volts for the PIN diode attenuator and three-stage power amplifier shown in FIG. 9.
Figure 12:
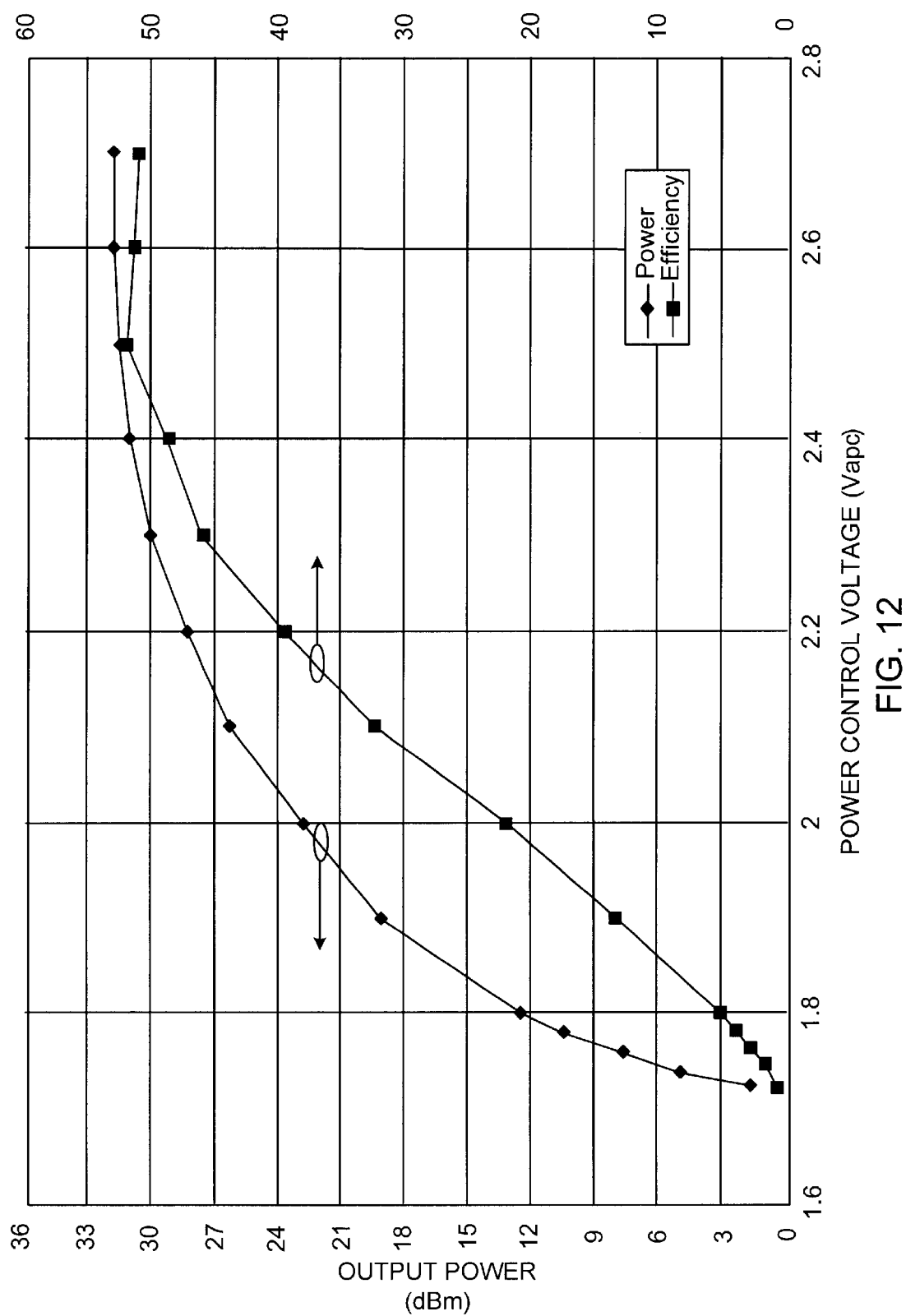
FIG. 12 is a graph illustrating the output power and associated power-added efficiency (PAE) as a function of power control voltage with supply voltage set at 2.7 volts for the PIN diode attenuator and three-stage power amplifier shown in FIG. 9.

FIGS. 11 and 12 are graphical representations depicting the operating efficiency and power achieved with the RF2140 power amplifier incorporating one embodiment of the present invention for bias circuit power supply voltages of 3.2 volts and 2.7 volts respectively when the input power is 6 dBm. As shown in FIG. 11, a peak power of 32.7 dBm for Vapc=2.7 volts is achieved in association with an operating efficiency of 50.6% with a supply voltage of 3.2 volts. As shown in FIG. 12, a peak power of 31.4 dBm and a peak efficiency of 51.3% is achieved with a supply voltage of 2.7 volts.

Figure 13:
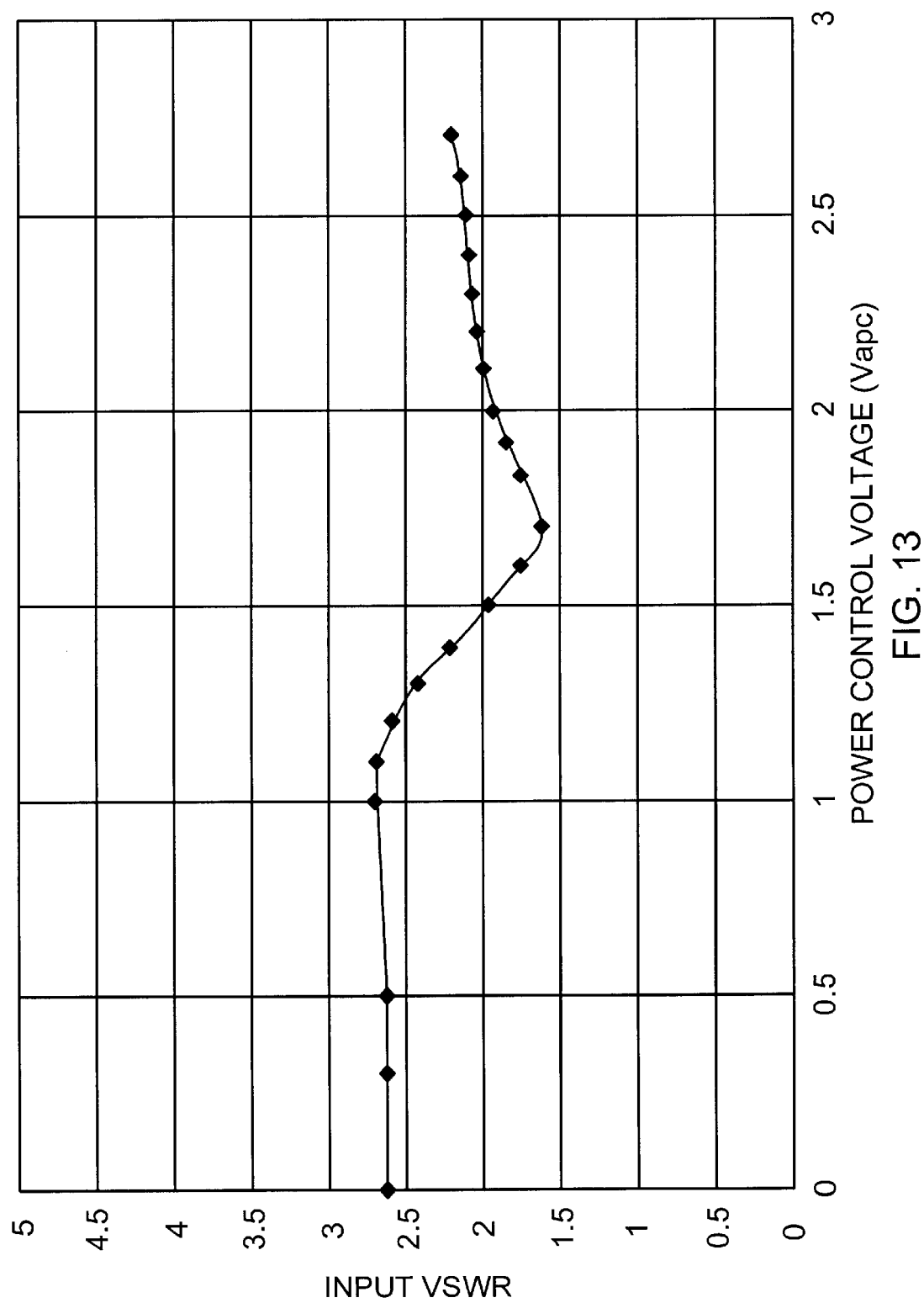
FIG. 13 is a graph illustrating the input voltage standing wave ratio (VSWR) as a function of power control voltage for the PIN diode attenuator and three-stage power amplifier shown in FIG. 9.

FIG. 13 is a graphical representation illustrating the input VSWR as a function of power control voltage (Vapc). The nominal VSWR is approximately 2:1 when the RF2140 power amplifier is operating. When Vapc is low, and the RF2140 power amplifier is off, the input VSWR is well under the 4:1 objective of most manufacturers, without the need for external matching components.

Certain modifications and improvements will occur to those skilled in the art upon a reading of the foregoing description. By way of example, a junction diode, Schottky diode, transistor connected as a diode, or other similar diode device could be used to functionally replace the PIN diode referenced herein. Further, the PIN diode can be replaced with multiple parallel diodes to achieve the desired result. Another example includes use of a resistor and inductor in combination to function as an RF choke to the PIN diode, as contrasted with sole use of either a resistor or an inductor. Yet another example includes the addition of a collector or emitter resistor associated with transistor Q2 in FIG. 1 to aid in the control of current to the PIN diode. It should be understood that all such modifications and improvements have been deleted herein for the sake of conciseness and readability but are properly within the scope of the following claims.

What is claimed is:

1. A high isolation RF power amplifier comprising:
   a radio frequency (RF) power amplifier having an RF signal input;
   a PIN diode electrically coupled to the RF signal input; and
   a variable current source having a control signal input and configured to adjust current flow through the PIN diode in response to a control signal to the control signal input, such that RF signals to the RF signal input are not attenuated when the RF power amplifier is in a forward gain mode and such that RF signals to the RF signal input are substantially fully attenuated when the RF power amplifier is in its off mode and further such that RF signals to the RF signal input are variably attenuated when the RF power amplifier is in a transition state between the forward gain mode and the off mode, wherein RF signals to the RF signal input are attenuated to minimize self-biasing associated with the RF power amplifier configured to receive the attenuated RF signals.

2. The RF power amplifier of claim 1 further comprising a switch associated with the PIN diode and configured to selectively enable and disable a current flow through the PIN diode.

3. The RF power amplifier of claim 2 wherein the PIN diode is configured to shunt RF power from the RF signal input to ground when the PIN diode is selectively turned on such that the RF power shunted to ground increases as current through the PIN diode increases.

4. The RF power amplifier of claim 1 wherein the RF power amplifier comprises at least one bipolar transistor.

5. The RF power amplifier of claim 4 wherein the at least one bipolar transistor comprises a heterojunction bipolar transistor (HBT).

6. The RF power amplifier of claim 1 further comprising at least one high frequency bypass capacitor configured to pass predetermined high frequency signals around the associated switch.

7. The RF power amplifier of claim 1 fuirther comprising at least one radio frequency (RF) blocking device configured to block predetermined RF signals to the PIN diode.

8. The RF power amplifier of claim 7 wherein the at least one radio frequency blocking device is selected from the group consisting of a resistor, a radio frequency choke and any combination thereof.

9. The RF power amplifier of claim 1 wherein the variable current source further comprises an inverting amplifier configured to control current flowing to the PIN diode as a function of a variable control voltage.

10. The RF power amplifier of claim 9 wherein the variable current source is further configured to selectively control a slope relationship between the control current flowing to the PIN diode and the variable control voltage.

11. A high isolation RF power amplifier comprising:
   a HBT RF power amplifier having a RF signal input;
   a diode having an anode and a cathode, the anode electrically coupled to the RF signal input and the cathode electrically coupled to ground;
   a variable current source having a power amplifier control voltage input and having a DC current output, the DC current output being electrically coupled to the anode; and
   a switching device electrically coupled between the cathode and ground.

12. The RF power amplifier of claim 11 wherein the variable current source comprises an inverting amplifier.

13. The RF power amplifier of claim 11 wherein the switching device comprises a control signal input.

14. The RF power amplifier of claim 11 further comprising a RF signal blocking device electrically coupled between the DC current output and the anode.

15. A high isolation RF power amplifier comprising:
   a RF power amplifier having a RF signal input and a RF signal output;
   diverting means for diverting a desired portion of a RF signal to ground and away from the RF signal input; and
   controlling means for varying the desired RF signal portion diverted to ground in response to a power amplifier control signal to generate an attenuated RF signal such that a predetermined isolation is achieved between the RF signal input and the RF signal output.

16. The RF power amplifier of claim 15 wherein the diverting means comprises a PIN diode.

17. The RF power amplifier of claim 15 wherein the controlling means comprises a variable current source.

18. A high isolation RF amplifier comprising:
   a RF amplifier having a RF signal input;
   a RF signal path associated with the RE signal input, the RF signal path having a predetermined attenuation characteristic;
   current generating means for providing a variable DC current having a value determined by a RF power amplifier control voltage; and
   means responsive to the current generating means for changing the attenuation characteristics associated with the RF signal path in response to the variable DC current wherein the attenuation characteristics are dependent upon the value of the DC current necessary to substantially eliminate self-biasing of the RF amplifier when the RF amplifier is not in a forward gain operating mode.

19. The RF power amplifier of claim 18 wherein the means for providing a variable DC current comprises an inverting amplifier responsive to a RF power amplifier control voltage.

20. The RF power amplifier of claim 18 wherein the means for changing the RE signal path attenuation characteristic comprises a PIN diode.

21. A method for eliminating self-biasing in a bipolar radio frequency amplifier, said method comprising the steps of:
   (a) providing a bipolar radio frequency amplifier having a radio frequency signal input;
   (b) electrically coupling a PIN diode attenuator to the radio frequency signal input;
   (c) providing a radio frequency amplifier control voltage;
   (d) providing a variable current source capable of allowing transmission of a current to the PIN diode in response to the radio frequency amplifier control voltage; and
   (e) transmitting a first predetermined current from the variable current source to the PIN diode in response to a selected radio frequency amplifier control voltage such that no more than sufficient radio frequency signal attenuation is achieved at the signal input to substantially eliminate self-biasing of the bipolar radio frequency power amplifier during transmission of large radio frequency signals to the radio frequency signal input when the radio frequency amplifier is in its off mode.

22. The method of claim 21 further comprising the step of:
   (f) transmitting a second predetermined current from the variable current source to the PIN diode in response to a selected radio frequency amplifier control voltage such that no more than sufficient radio frequency signal attenuation is achieved at the signal input to substantially eliminate self-biasing of the bipolar radio frequency power amplifier during transmission of large radio frequency signals to the radio frequency signal input when the radio frequency amplifier is in a transition state between its off mode and its on mode.

23. The method of claim 22 further comprising the step of:
   (g) providing a switching device capable of turning the PIN diode attenuator on and off.

24. The method of claim 23 further comprising the step of:
   (h) activating the switching device when the bipolar radio frequency amplifier is powered down such that the PIN diode is turned off, thereby disallowing current to flow through the PIN diode.

* * * * *